US011024656B2

(12) United States Patent
Okabe et al.

(10) Patent No.: US 11,024,656 B2
(45) Date of Patent: Jun. 1, 2021

(54) ACTIVE MATRIX SUBSTRATE, OPTICAL SHUTTER SUBSTRATE, DISPLAY DEVICE, AND METHOD FOR MANUFACTURING ACTIVE MATRIX SUBSTRATE

(71) Applicant: Sharp Kabushiki Kaisha, Sakai (JP)

(72) Inventors: Tohru Okabe, Sakai (JP); Hirohiko Nishiki, Sakai (JP); Takeshi Yaneda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 284 days.

(21) Appl. No.: 16/309,134

(22) PCT Filed: Jun. 21, 2017

(86) PCT No.: PCT/JP2017/022877
§ 371 (c)(1),
(2) Date: Dec. 12, 2018

(87) PCT Pub. No.: WO2018/003633
PCT Pub. Date: Jan. 4, 2018

(65) Prior Publication Data
US 2020/0312888 A1 Oct. 1, 2020

(30) Foreign Application Priority Data
Jun. 28, 2016 (JP) .............................. JP2016-128109

(51) Int. Cl.
*H01L 27/12* (2006.01)
*G02B 26/02* (2006.01)
(Continued)

(52) U.S. Cl.
CPC ........ *H01L 27/1244* (2013.01); *H01L 27/127* (2013.01); *H01L 27/1225* (2013.01);
(Continued)

(58) Field of Classification Search
CPC ... H01L 21/326; H01L 29/876; H01L 33/382; H01L 33/387; H01L 27/3276;
(Continued)

(56) References Cited

U.S. PATENT DOCUMENTS 8,569,772 B2* 10/2013 Kim ..................... H01L 33/14
257/82
10,670,933 B2* 6/2020 Okabe ................. G02F 1/1368
(Continued)

FOREIGN PATENT DOCUMENTS

JP 2011-043856 A 3/2011
JP 2016-057547 A 4/2016
(Continued)

OTHER PUBLICATIONS

Official Communication issued in International Patent Application No. PCT/JP20171022877, dated Sep. 12, 2017.

*Primary Examiner* — David A Zarneke
(74) *Attorney, Agent, or Firm* — Keating & Bennett, LLP

(57) ABSTRACT

An active matrix substrate in which step-caused disconnection of a metal film in a contact hole does not easily occur includes a first to third insulating films and first to third metal films on a glass substrate and a contact hole electrically connecting the first and second metal film, the contact hole including first to third hole present respectively in the first to third insulating films, the first and third metal films being in contact with each other inside the first hole, the second insulating film and an oxide semiconductor film overlapping with each other in a region below the third hole, the second and third metal films being in contact with each other in a region above the first insulating film and either inside or below the third hole.

18 Claims, 14 Drawing Sheets

(51) Int. Cl.
  *G02F 1/1362* (2006.01)
  *H01L 27/32* (2006.01)
  *H01L 33/38* (2010.01)
  *G02F 1/1333* (2006.01)
  *G02F 1/1345* (2006.01)
  *H01L 21/326* (2006.01)
  *H01L 33/44* (2010.01)
  *G02F 1/1343* (2006.01)

(52) U.S. Cl.
  CPC .......... *H01L 27/1248* (2013.01); *G02B 26/02* (2013.01); *G02F 1/1345* (2013.01); *G02F 1/133302* (2021.01); *G02F 1/133305* (2013.01); *G02F 1/134309* (2013.01); *G02F 1/134336* (2013.01); *G02F 1/136286* (2013.01); *H01L 21/326* (2013.01); *H01L 27/3241* (2013.01); *H01L 27/3244* (2013.01); *H01L 27/3276* (2013.01); *H01L 27/3288* (2013.01); *H01L 33/382* (2013.01); *H01L 33/387* (2013.01); *H01L 33/44* (2013.01)

(58) Field of Classification Search
  CPC ............. H01L 27/3341; H01L 27/3344; H01L 27/3288; H01L 27/3297; G02F 1/33302; G02F 1/133305; G02F 1/134309; G02F 1/134336; G02F 1/1345
  See application file for complete search history.

(56) References Cited

U.S. PATENT DOCUMENTS

| | | |
|---|---|---|
| 2006/0187190 A1 | 8/2006 | Hagood et al. |
| 2006/0187191 A1 | 8/2006 | Hagood et al. |
| 2006/0187528 A1 | 8/2006 | Hagood et al. |
| 2006/0187529 A1 | 8/2006 | Hagood et al. |
| 2006/0187530 A1 | 8/2006 | Hagood et al. |
| 2006/0187531 A1 | 8/2006 | Hagood et al. |
| 2006/0209012 A1 | 9/2006 | Hagood, IV |
| 2006/0250325 A1 | 11/2006 | Hagood et al. |
| 2006/0250676 A1 | 11/2006 | Hagood, IV |
| 2006/0256039 A1 | 11/2006 | Hagood et al. |
| 2007/0002156 A1 | 1/2007 | Hagood, IV et al. |
| 2007/0030555 A1 | 2/2007 | Barton et al. |
| 2007/0086078 A1 | 4/2007 | Hagood et al. |
| 2007/0091038 A1 | 4/2007 | Hagood, IV et al. |
| 2007/0159679 A1 | 7/2007 | Hagood et al. |
| 2007/0195026 A1 | 8/2007 | Hagood et al. |
| 2007/0205969 A1 | 9/2007 | Hagood, IV et al. |
| 2007/0216987 A1 | 9/2007 | Hagood et al. |
| 2007/0223080 A1 | 9/2007 | Hagood, IV et al. |
| 2008/0030827 A1 | 2/2008 | Hagood et al. |
| 2008/0037104 A1 | 2/2008 | Hagood et al. |
| 2008/0062500 A1 | 3/2008 | Hagood, IV |
| 2008/0123175 A1 | 5/2008 | Hagood et al. |
| 2008/0129681 A1 | 6/2008 | Hagood et al. |
| 2008/0145527 A1 | 6/2008 | Hagood et al. |
| 2008/0151357 A1 | 6/2008 | Hagood, IV et al. |
| 2008/0158635 A1 | 7/2008 | Hagood et al. |
| 2008/0158636 A1 | 7/2008 | Hagood et al. |
| 2008/0174532 A1 | 7/2008 | Lewis |
| 2008/0278798 A1 | 11/2008 | Hagood et al. |
| 2008/0283175 A1 | 11/2008 | Hagood et al. |
| 2009/0034052 A1 | 2/2009 | Hagood et al. |
| 2009/0103164 A1 | 4/2009 | Fijol et al. |
| 2009/0195855 A1 | 8/2009 | Steyn et al. |
| 2009/0244678 A1 | 10/2009 | Hagood, IV et al. |
| 2010/0110518 A1 | 5/2010 | Wu et al. |
| 2011/0122474 A1 | 5/2011 | Payne et al. |
| 2011/0148948 A1 | 6/2011 | Gandhi et al. |
| 2011/0164067 A1 | 7/2011 | Lewis et al. |
| 2011/0255146 A1 | 10/2011 | Brosnihan et al. |
| 2011/0267668 A1 | 11/2011 | Hagood, IV et al. |
| 2012/0169795 A1 | 7/2012 | Hagood et al. |
| 2012/0200906 A1 | 8/2012 | Wu et al. |
| 2012/0280971 A1 | 11/2012 | Hagood et al. |
| 2012/0320111 A1 | 12/2012 | Hagood, IV et al. |
| 2012/0320112 A1 | 12/2012 | Hagood, IV et al. |
| 2012/0320113 A1 | 12/2012 | Hagood, IV et al. |
| 2013/0010341 A1 | 1/2013 | Hagood et al. |
| 2013/0010342 A1 | 1/2013 | Hagood, IV et al. |
| 2013/0010344 A1 | 1/2013 | Hagood et al. |
| 2013/0215370 A1 | 8/2013 | Takanishi et al. |
| 2013/0292666 A1* | 11/2013 | Sonoda ................ C23C 14/042 257/40 |
| 2013/0335806 A1 | 12/2013 | Steyn et al. |
| 2013/0342522 A1 | 12/2013 | Hagood et al. |
| 2014/0085698 A1 | 3/2014 | Wu et al. |
| 2015/0286047 A1 | 10/2015 | Lewis et al. |
| 2015/0294613 A1 | 10/2015 | Gandhi et al. |
| 2016/0275876 A1 | 9/2016 | Hagood et al. |
| 2018/0120658 A1* | 5/2018 | Kanaya ............... G02F 1/13624 |
| 2020/0212356 A1* | 7/2020 | Kim .................... H01L 51/5253 |

FOREIGN PATENT DOCUMENTS

| | | |
|---|---|---|
| WO | 2012/023226 A1 | 2/2012 |
| WO | 2013/008441 A1 | 1/2013 |

* cited by examiner

ACTIVE MATRIX SUBSTRATE, OPTICAL SHUTTER SUBSTRATE, DISPLAY DEVICE, AND METHOD FOR MANUFACTURING ACTIVE MATRIX SUBSTRATE

TECHNICAL FIELD

The present invention relates to an active matrix substrate for use in a display device.

BACKGROUND ART

Display devices such as liquid crystal display devices, organic EL display devices, and MEMS (Micro Electro Mechanical Systems) displays include an active matrix substrate provided with an array of thin film transistors (TFTs).

CITATION LIST

Patent Literature

[Patent Literature 1]
Japanese Patent Application Publication, Tokukai, No. 2011-43856 (Publication date: Mar. 3, 2011)

SUMMARY OF INVENTION

Technical Problem

A typical active matrix substrate has a structure in which two metal films present in respective layers different from each other are electrically connected to each other via contact holes. Such two metal films may suffer from faulty connection as a result of step-caused disconnection of a metal film in a contact hole.

It is an object of the present invention to provide an active matrix substrate in which step-caused disconnection of a metal film in a contact hole does not easily occur.

Solution to Problem

An active matrix substrate in accordance with an aspect of the present invention includes: a substrate; a first insulating film present in a layer above the substrate; a second insulating film present in a layer above the first insulating film; a third insulating film present in a layer above the second insulating film; a first metal film present between the substrate and the first insulating film; a second metal film present in a layer between the second insulating film and the third insulating film; a third metal film having a portion present in a layer above the third insulating film; an oxide semiconductor film present in a layer between the second insulating film and the second metal film; and a contact hole electrically connecting the first metal film and the second metal film to each other, the contact hole including a first hole in the first insulating film, a second hole in the second insulating film, and a third hole in the third insulating film, the first metal film and the third metal film being in contact with each other inside the first hole, the second insulating film and the oxide semiconductor film overlapping with each other in a region below the third hole, the second metal film and the third metal film being in contact with each other in a region above the first insulating film and either inside or below the third hole.

Advantageous Effects of Invention

The above configuration makes it possible to provide an active matrix substrate in which step-caused disconnection of a conductor film in a contact hole does not easily occur.

Figure 4:
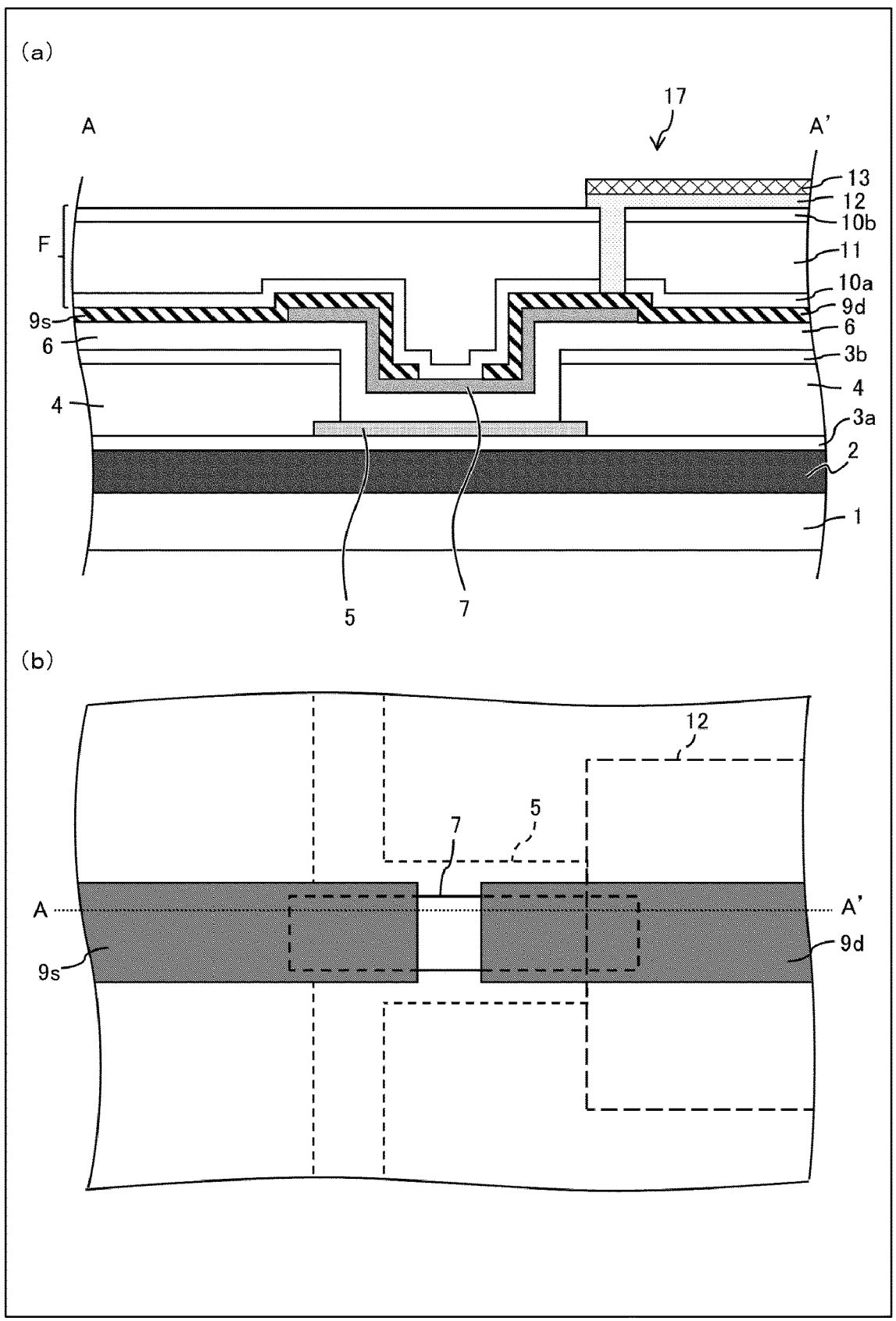

(a) of FIG. 4 is a cross-sectional view of an active matrix substrate (TFT portion) in accordance with Embodiment 1. (b) of FIG. 4 is a perspective plan view corresponding to (a) of FIG. 4.

Figure 5:
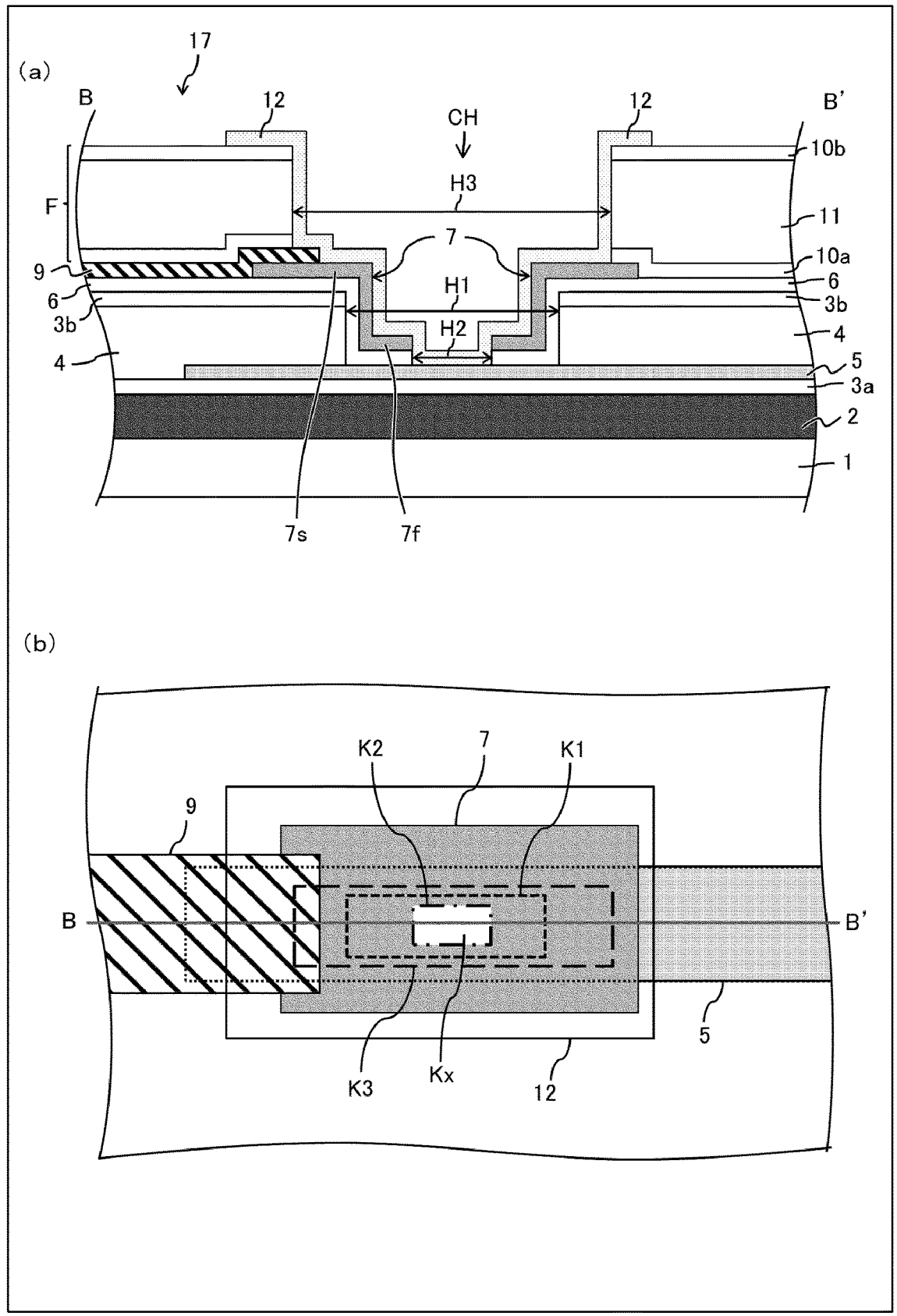

(a) of FIG. 5 is a cross-sectional view of an active matrix substrate (contact hole portion) in accordance with Embodiment 1. (b) of FIG. 5 is a perspective plan view corresponding to (a) of FIG. 5.

Figure 6:
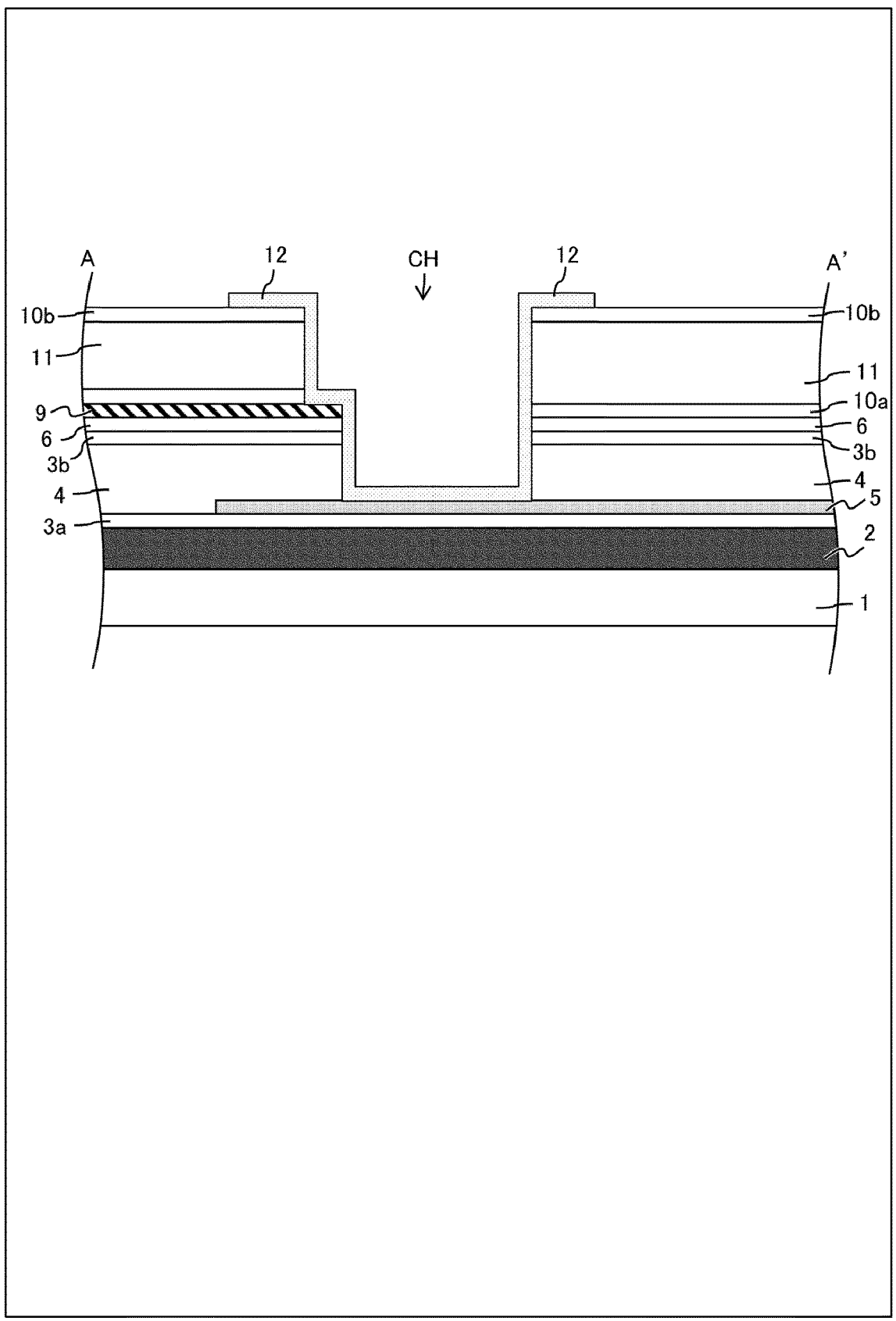

FIG. 6 provides cross-sectional views of an active matrix substrate in accordance with a reference embodiment.

Figure 7:
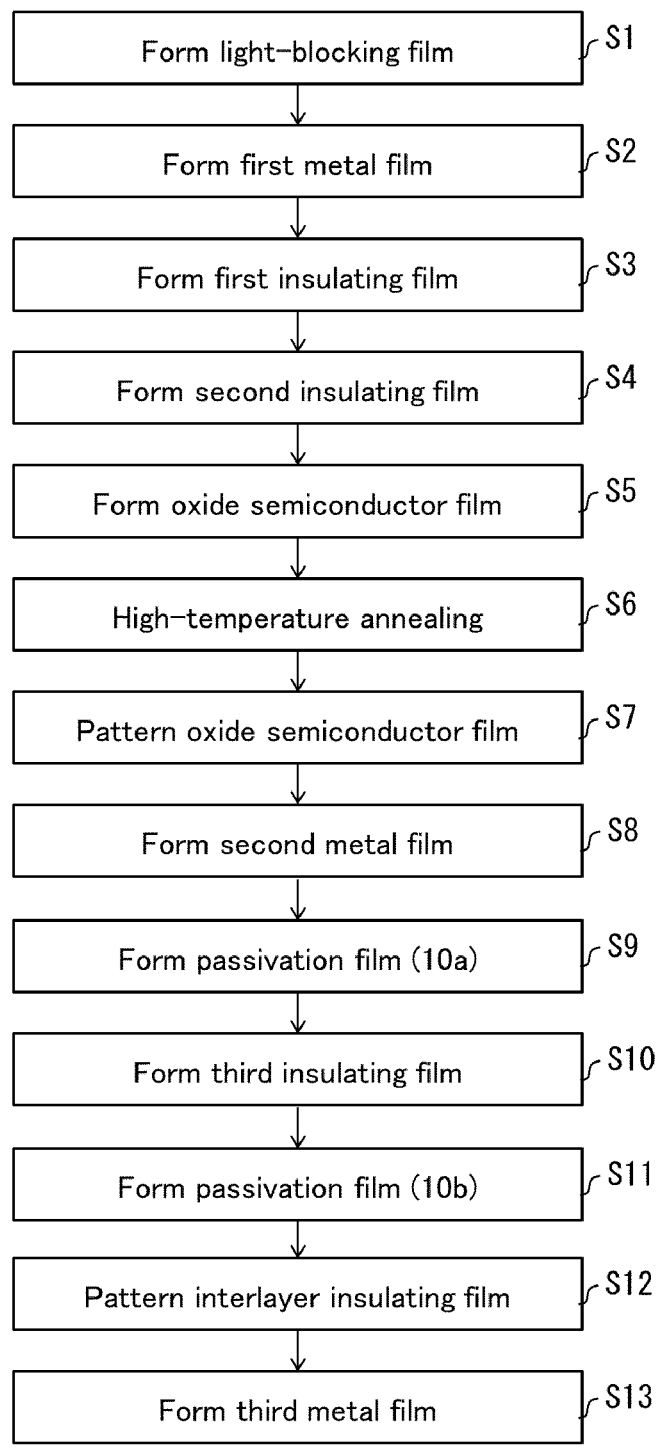

FIG. 7 is a flowchart that shows a process of producing an active matrix substrate in accordance with Embodiment 1.

Figure 8:
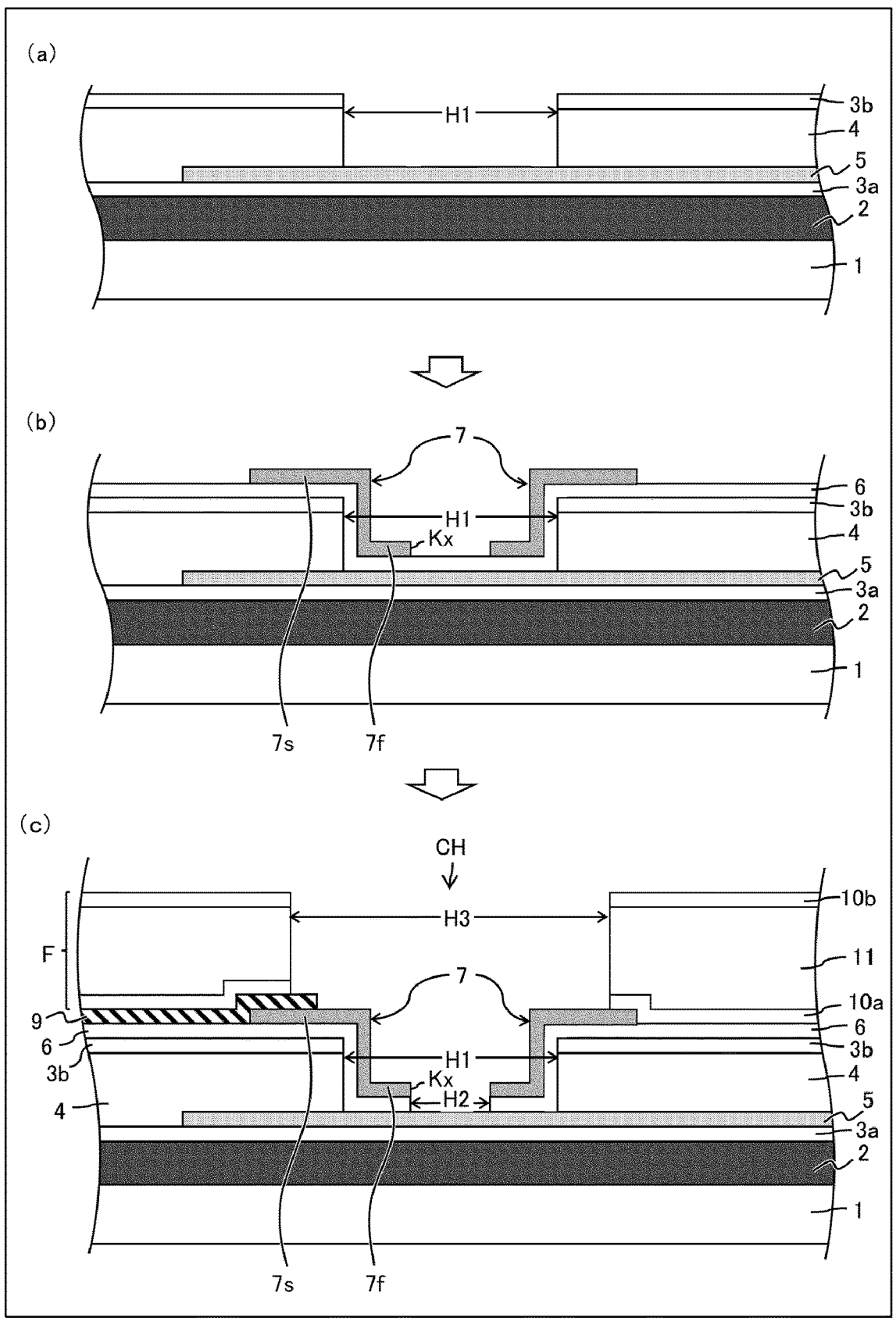

FIG. 8 provides cross-sectional diagrams illustrating a process of producing an active matrix substrate in accordance with Embodiment 1.

Figure 9:
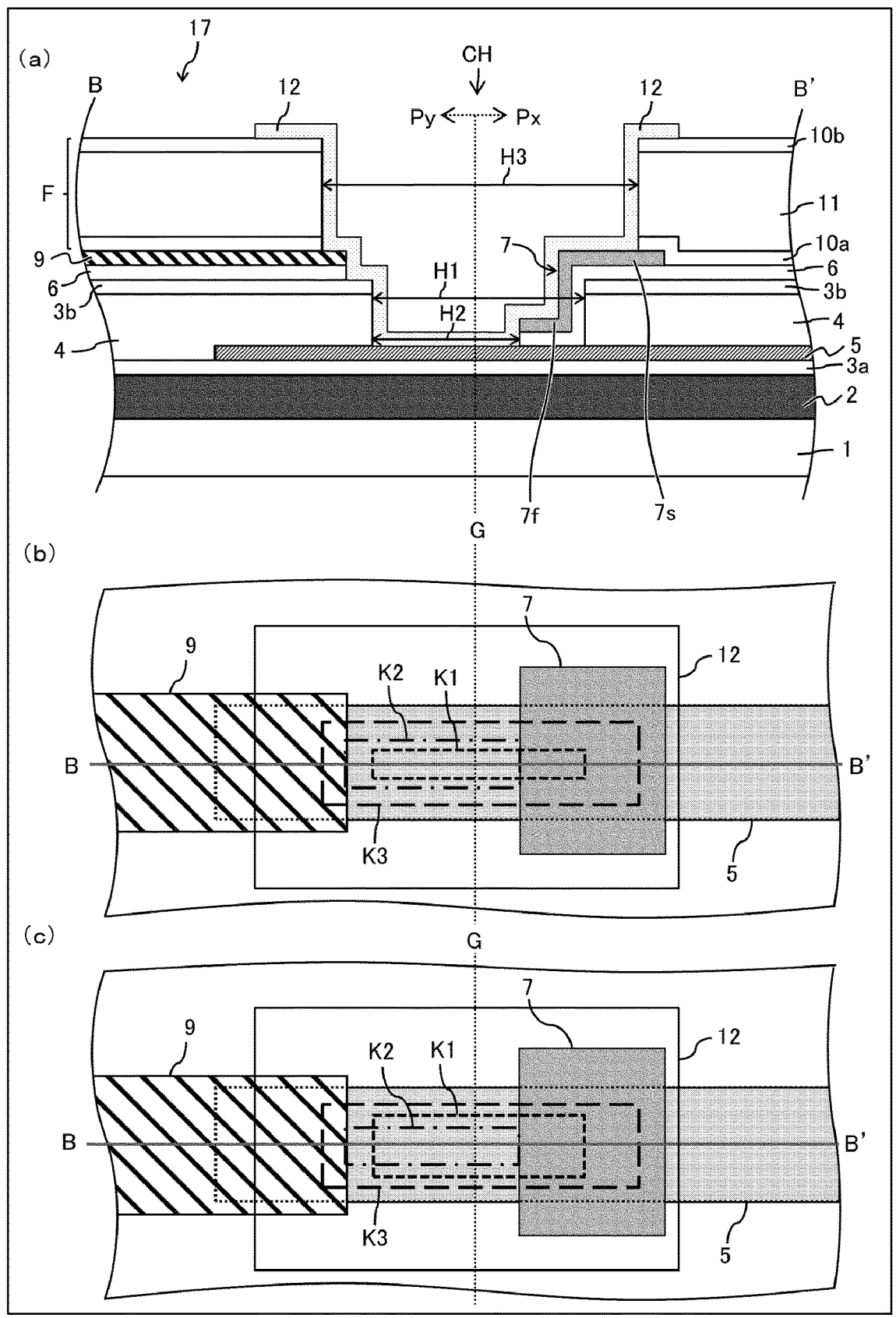

(a) of FIG. 9 is a cross-sectional view of an active matrix substrate (contact hole portion) in accordance with Embodiment 2. (b) and (c) of FIG. 9 are each a perspective plan view corresponding to (a) of FIG. 9.

Figure 10:
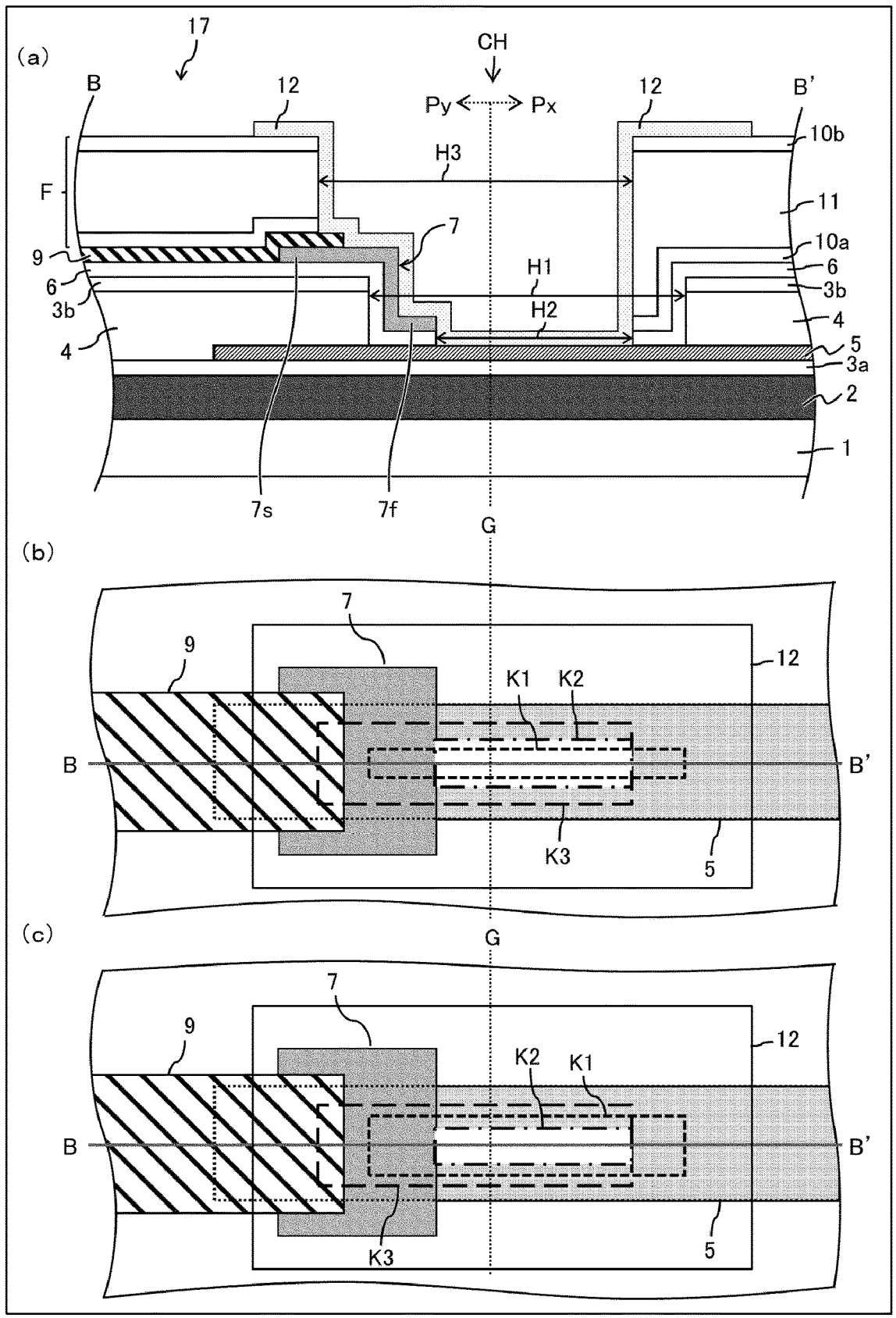

(a) of FIG. 10 is a cross-sectional view of an active matrix substrate (contact hole portion) in accordance with Embodiment 3. (b) and (c) of FIG. 10 are each a perspective plan view corresponding to (a) of FIG. 10.

Figure 11:
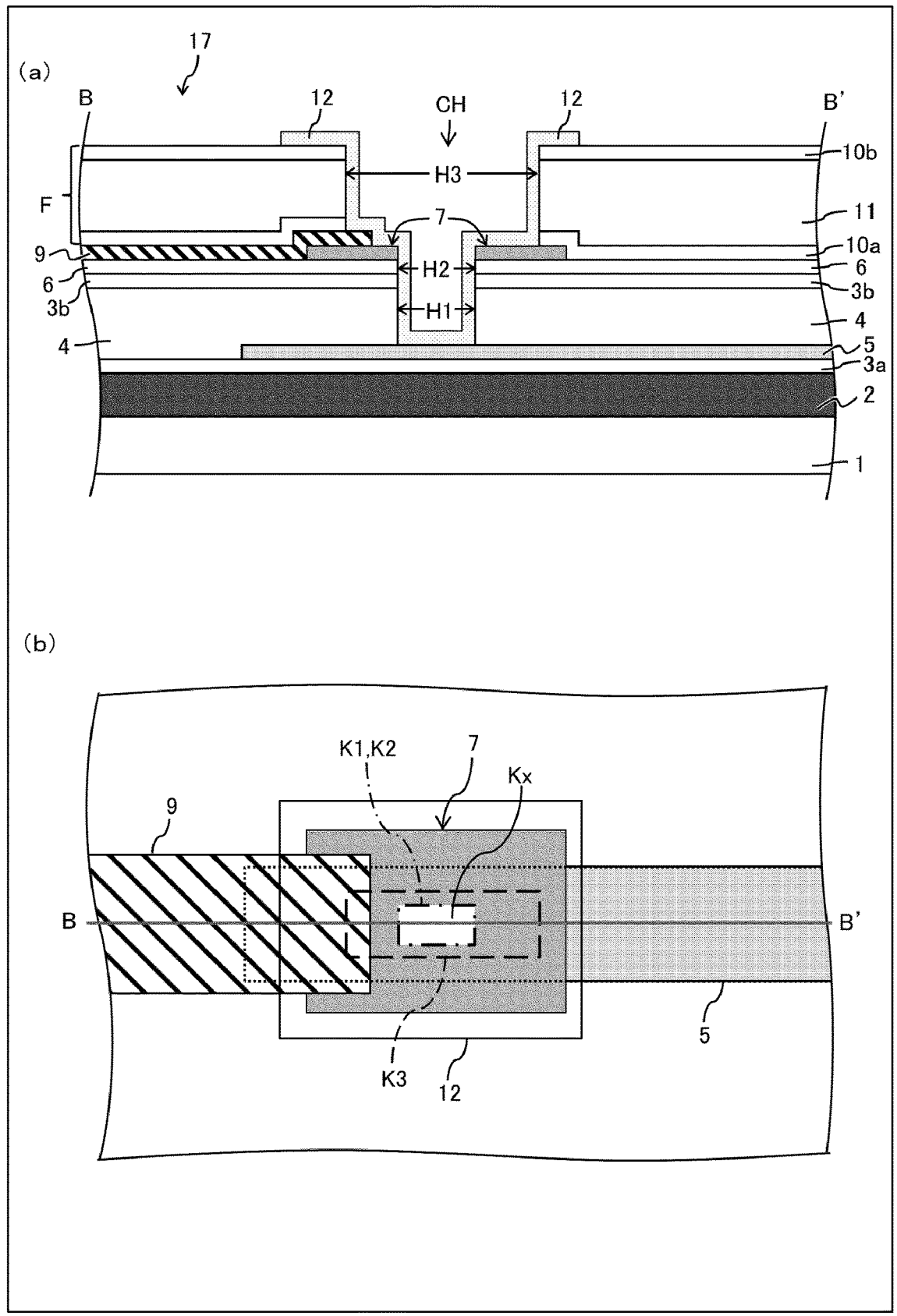

(a) of FIG. 11 is a cross-sectional view of an active matrix substrate (contact hole portion) in accordance with Embodiment 4. (b) and (c) of FIG. 11 are each a perspective plan view corresponding to (a) of FIG. 11.

Figure 12:
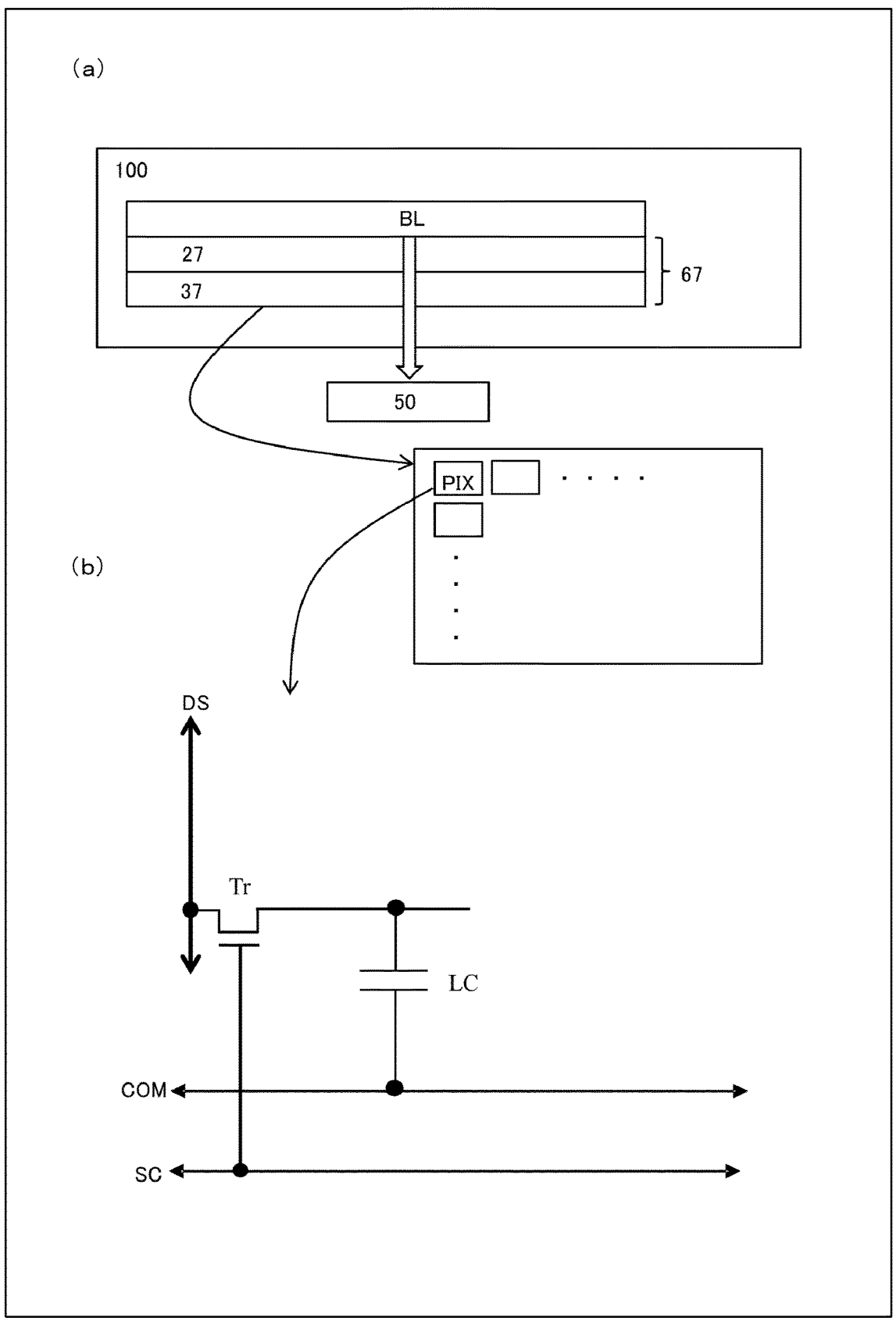

FIG. 12 provides diagrams each schematically illustrating the configuration of a display device in accordance with Embodiment 5.

Figure 13:
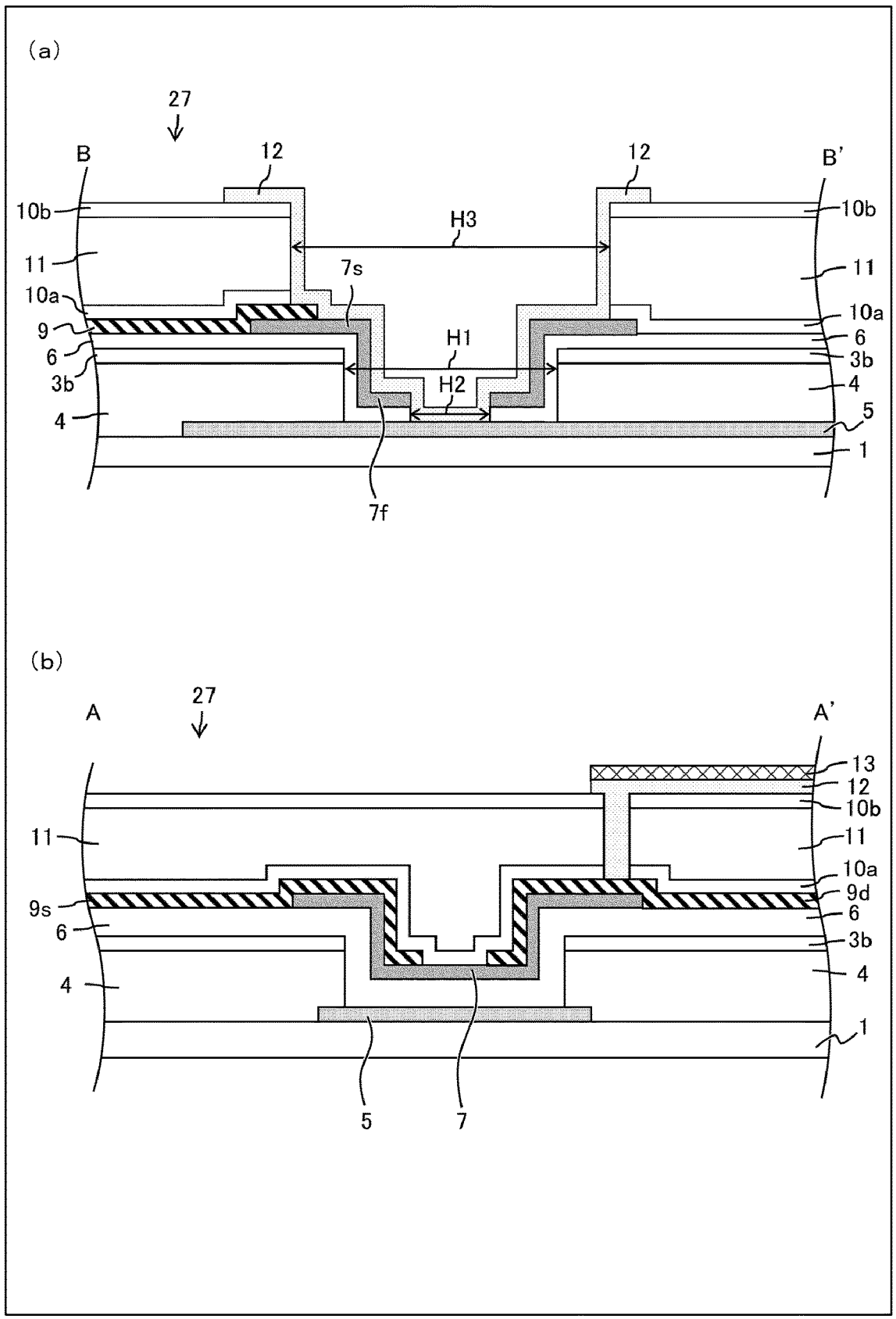

FIG. 13 provides cross-sectional views of an active matrix substrate in accordance with Embodiment 5.

Figure 14:
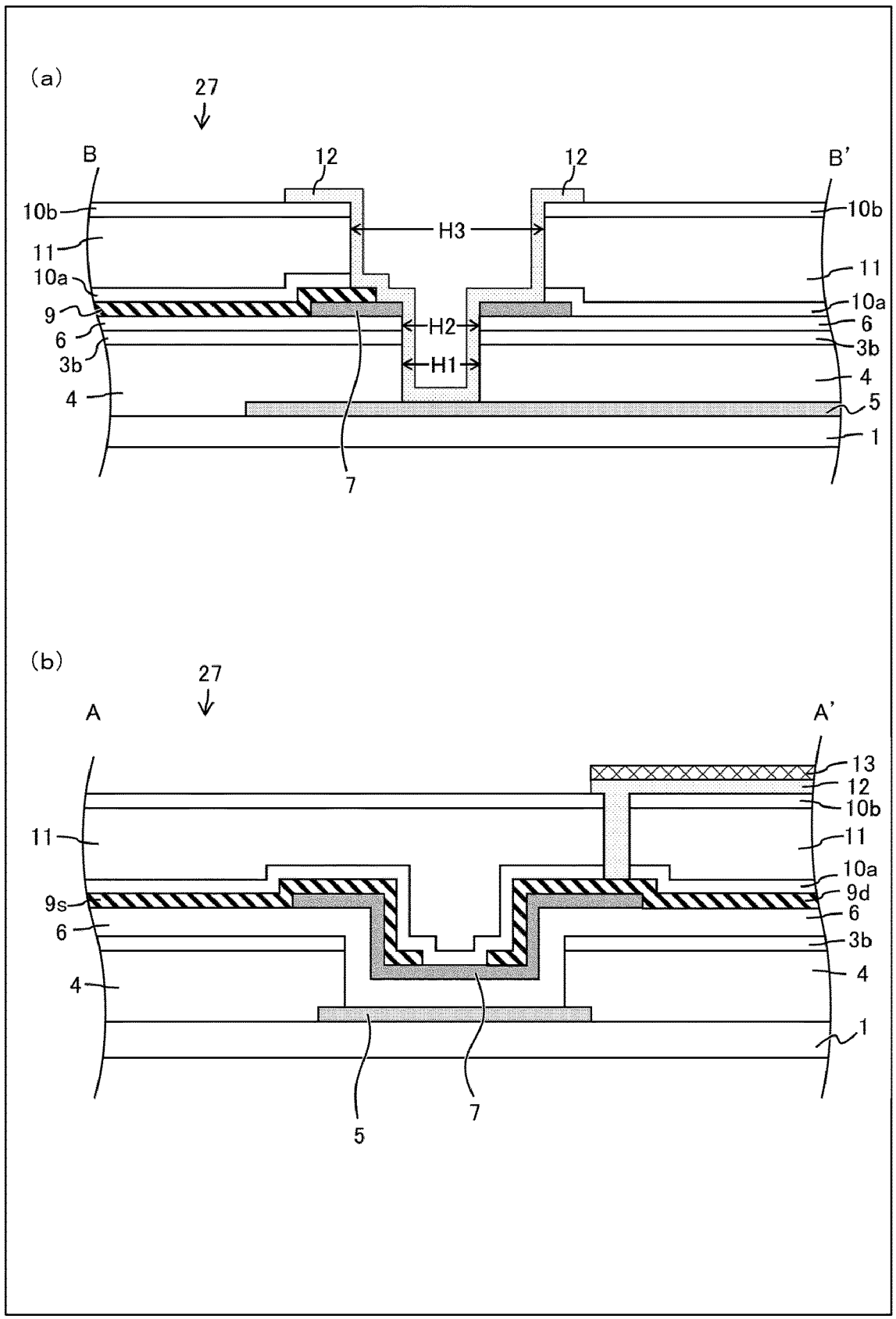

FIG. 14 provides cross-sectional views of another active matrix substrate in accordance with Embodiment 5.

DESCRIPTION OF EMBODIMENTS

The following description will discuss embodiments of the present invention with reference to FIGS. 1 to 14.

Embodiment 1

(MEMS Display)

Figure 1:
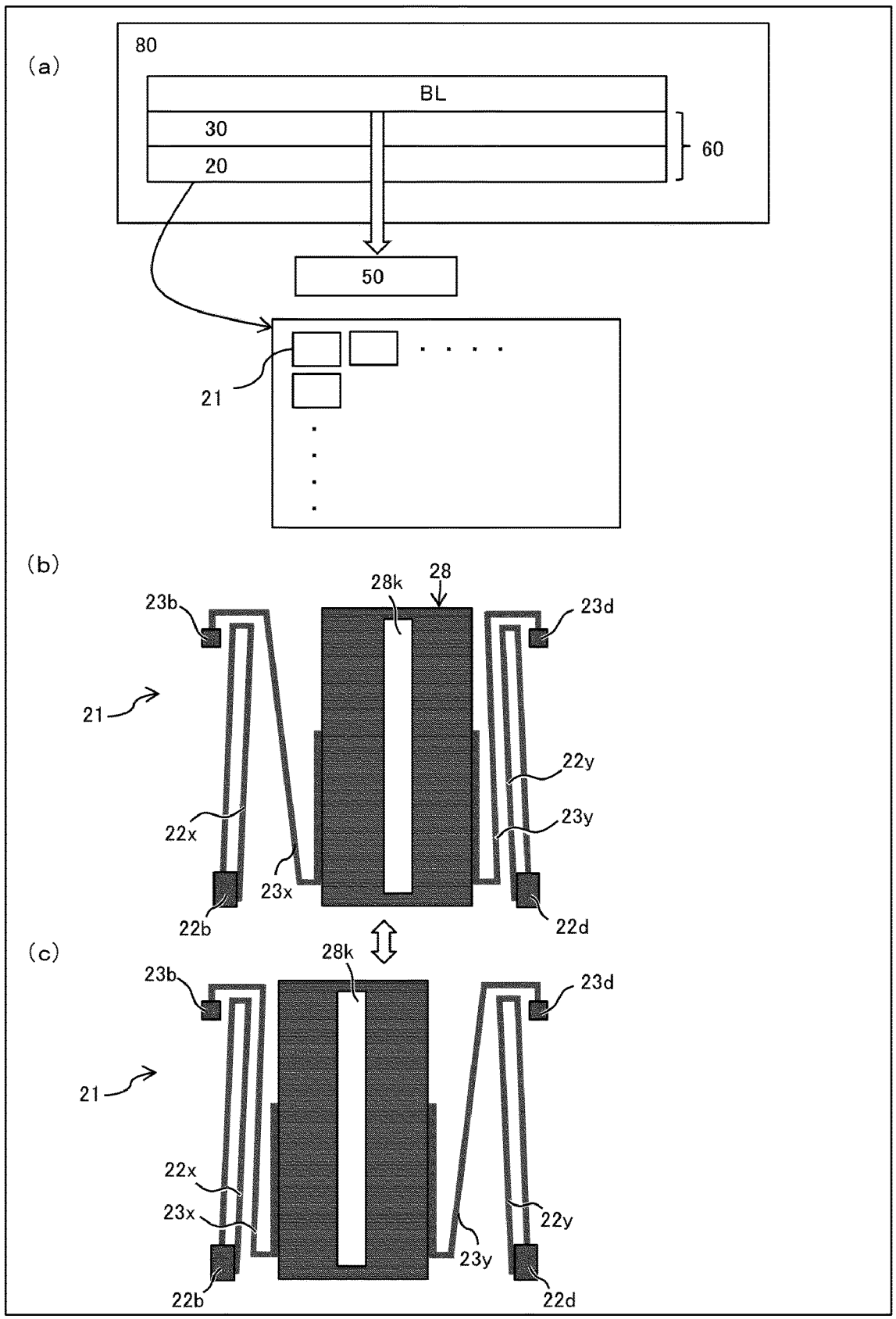
FIG. 1 provides diagrams each schematically illustrating the configuration of a display device in accordance with Embodiment 1.

As illustrated in FIG. 1, a MEMS display 80 in accordance with Embodiment 1 includes (i) an optical shutter device 60 including an optical shutter substrate 20 and a counter substrate 30 facing the optical shutter substrate 20 and (ii) a backlight BL configured to emit, for example, LED light or laser light through the counter substrate 30 to the optical shutter substrate 20.

(Configuration of Optical Shutter Substrate)

Figure 2:
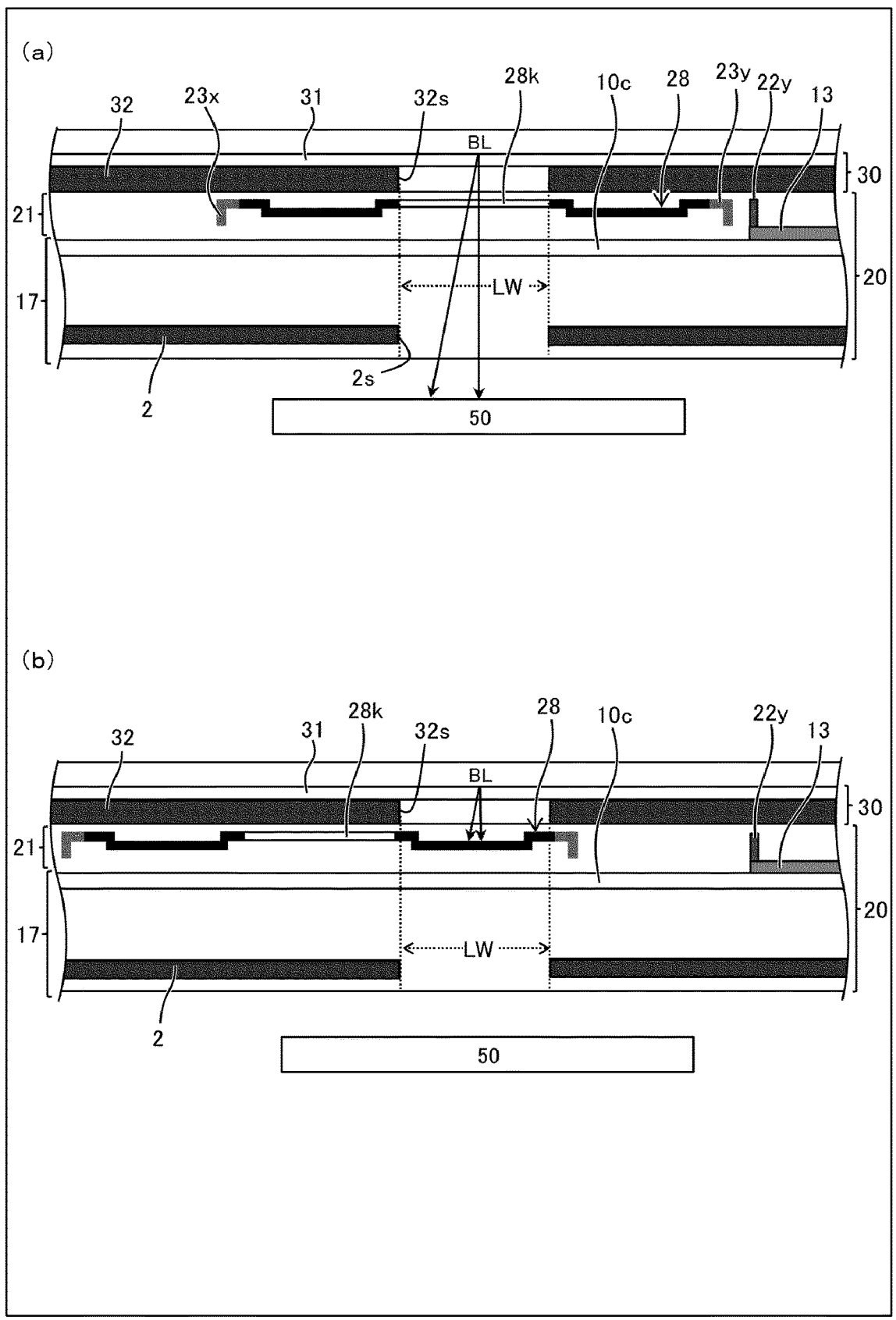
FIG. 2 provides cross-sectional diagrams each illustrating the configuration of an optical shutter substrate in accordance with Embodiment 1.

As illustrated in FIG. 2, the optical shutter substrate 20 includes (i) an active matrix substrate 17 including transistors (TFTs) and (ii) a plurality of optical shutter mechanisms 21 as MEMS (Micro Electro Mechanical Systems) devices present on the backlight BL side of the active matrix substrate 17. The optical shutter mechanisms 21 each correspond to a pixel. The optical shutter substrate 20 has light transmission paths through each of which light having passed through an optical shutter mechanism 21 travels.

Each optical shutter mechanism 21 includes, as illustrated in FIGS. 1 and 2, (i) a shutter body 28 having an opening 28k, (ii) a shutter beam 23x connected to a side end of the shutter body 28, (iii) a shutter beam 23y connected to another side end of the shutter body 28, (iv) a driving beam 22x facing the shutter beam 23x, and (v) a driving beam 22y facing the shutter beam 23y.

The shutter beam 23x is connected to a shutter line of the active matrix layer via a shutter anchor 23b. The shutter beam 23y is connected to another shutter line of the active matrix layer via a shutter anchor 23d. The driving beam 22x is connected to a TFT of the active matrix layer via a driving anchor 22b. The driving beam 22y is connected to another TFT of the active matrix layer via a driving anchor 22d. Controlling the respective electric potentials of the driving beams 22x and 22y allows the spring-like shutter beams 23x and 23y to deform, thereby allowing the shutter body 28 to slide parallel to the substrate surface. This controls the amount of light emitted through the optical shutter mechanism and the light transmission path toward a viewer 50 for image display.

Figure 3:
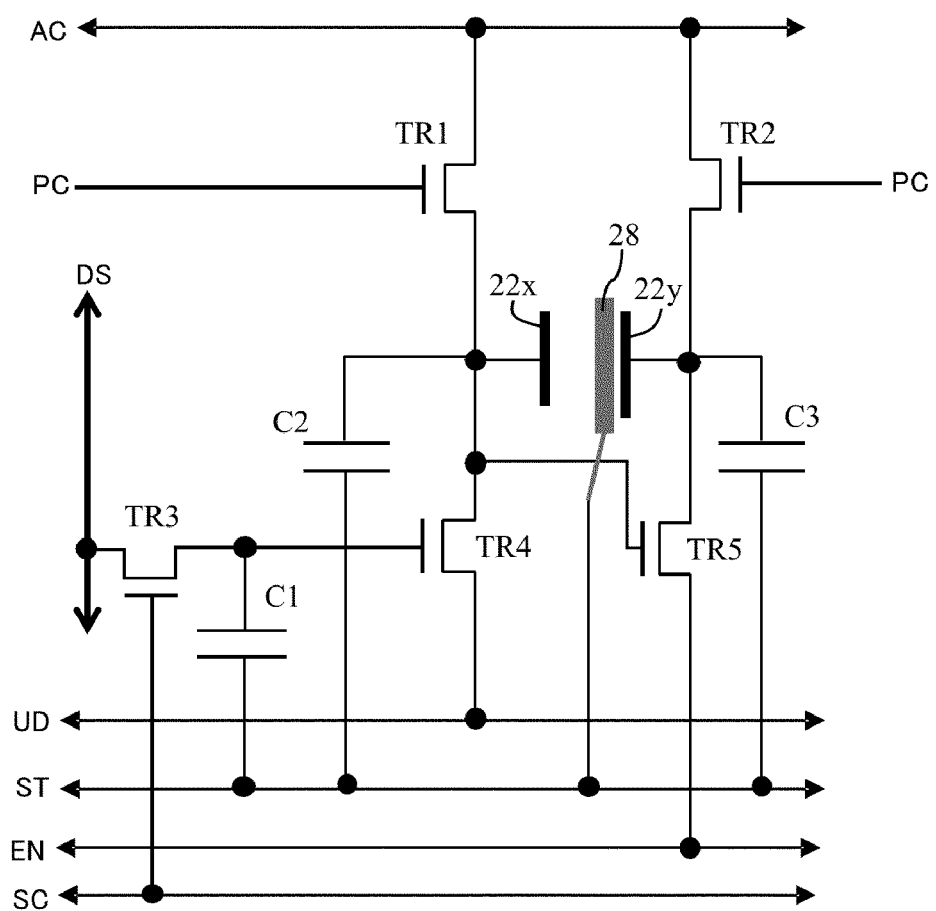
FIG. 3 is a circuit diagram illustrating the configuration of an optical shutter substrate in accordance with Embodiment 1.

FIG. 3 is a circuit diagram illustrating the configuration of a portion of the optical shutter substrate 20. As illustrated in FIG. 3, the optical shutter substrate includes seven signal lines (namely, a scanning line SC, a data line DS, an actuate line AC, an update line UD, a shutter line ST, a precharge line PC, and an enable line EN), transistors TR1 to TR5, a data retention capacitor C1, a master capacitor C2, and a slave capacitor C3.

With the configuration illustrated in FIG. 3, when the scanning line SC has been selected, a data voltage on the basis of which the corresponding optical shutter mechanism is opened or closed is stored in the data retention capacitor C1 via the data line DS and the transistor TR3. During this period, the update line UD is at a high level, and the transistor TR4 is off regardless of the data voltage.

Next, when the precharge line PC has been selected, an electric charge from the actuate line AC is stored in the driving beam 22x (which is connected to the master capacitor C2) via the transistor TR1 and in the driving beam 22y (which is connected to the slave capacitor C3) via the transistor TR2.

Next, when the level of the update line UD has been changed from high to low, the transistor TR4 is controlled according to the data voltage. Specifically, in a case where the data voltage is at a high level, the transistor TR4 is turned on, whereas in a case where the data voltage is at a low level, the transistor TR4 remains off.

Next, when the level of the enable line EN has been changed from high to low, the transistor TR5 is controlled according to the voltage of the driving beam 22x. Specifically, in a case where the data voltage is at a low level and the driving beam 22x is at a high level, the transistor TR5 is turned on, whereas the data voltage is at a high level and the driving beam 22x is at a low level, the transistor TR5 is turned off.

The driving beams 22x and 22y are opposite in polarity to each other as described above. That driving beam (22x or 22y) which is opposite in polarity to the shutter body 28 electrically attracts the shutter body 28. The shutter body 28 is supplied from the shutter line ST with a signal having a periodically reversed polarity for an antistatic effect.

As illustrated in FIGS. 1 and 2, each optical shutter mechanism 21 is configured such that when the shutter body 28 has been attracted toward the driving beam 22y, the optical shutter mechanism is open as illustrated in (b) of FIG. 1 and (a) of FIG. 2 and that when the shutter body 28 has been attracted toward the driving beam 22x, the optical shutter mechanism is closed as illustrated in (c) of FIG. 1 and (b) of FIG. 2.

The optical shutter device illustrated in FIG. 2 includes, between the optical shutter substrate 20 and the backlight BL, a counter substrate 30 including a glass substrate 31 and a light-blocking layer 32 present on the glass substrate 31 and made of, for example, metal. The optical shutter device has light transmission paths LW each extending from a slit 32s in the light-blocking layer 32 of the counter substrate 30 perpendicularly to the substrate surface to a slit 2s in a light-blocking film 2 of the optical shutter substrate 20. When the opening 28k of the shutter body 28 coincides with the corresponding light transmission path LW (that is, the optical shutter mechanism is open), backlight travels through the optical shutter mechanism and the light transmission path LW toward the viewer 50 as illustrated in (a) of FIG. 2. When a portion of the shutter body 28 other than the opening coincides with the corresponding light transmission path LW (that is, the optical shutter mechanism is closed), backlight is blocked as illustrated in (b) of FIG. 3.

(Configuration of Active Matrix Substrate)

(a) of FIG. 4 is a cross-sectional view of a TFT portion of the active matrix substrate in accordance with Embodiment 1. (b) of FIG. 4 is a perspective plan view corresponding to (a) of FIG. 4. (a) of FIG. 5 is a cross-sectional view of a metal film contact hole portion of the active matrix substrate in accordance with Embodiment 1. (b) of FIG. 5 is a perspective plan view corresponding to (a) of FIG. 5.

As illustrated in FIGS. 4 and 5, the active matrix substrate 17 includes a glass substrate 1, a light-blocking film 2 present in a layer above the glass substrate 1, an inorganic film 3a present in a layer above the light-blocking film 2, a first metal film 5 present in a layer above the inorganic film 3a, a first insulating film 4 present in a layer above the first metal film 5, an inorganic film 3b present in a layer above the first insulating film 4, a second insulating film 6 present in a layer above the inorganic film 3b, an oxide semiconductor film 7 present in a layer above the second insulating film 6, a second metal film 9 (9s, 9d) present in a layer above the oxide semiconductor film 7, a passivation film 10a present in a layer above the second metal film 9, a third insulating film 11 present in a layer above the passivation film 10a, a passivation film 10b present in a layer above the third insulating film 11, a third metal film 12 present in a layer above the passivation film 10b, and a fourth metal film 13 present in a layer above the third metal film 12.

The light-blocking film 2 is made of a light-blocking resin that can be applied to a surface (for example, a spin-on glass material). The first insulating film 4 and the third insulating film 11 are each made of a light-transmitting resin that can be applied to a surface (for example, a spin-on glass material). The first insulating film 4 and the third insulating film 11 may each be made of an organic SOG material or a photosensitive organic material (for example, a mixture of an insulating material such as novolac resin and a photosensitive material). The light-blocking film 2, the first insulating film 4, and the third insulating film 11 each have a thickness (0.5 μm to 3 μm) larger than the respective thicknesses of the first metal film 5 and the second metal film 9, and each double as a planarizing film.

The inorganic insulating films 3a and 3b each allow a subjacent film and a superjacent film to adhere to each other more securely. The inorganic insulating films 3a and 3b each have a thickness within a range of approximately 50 nm to 200 nm. The inorganic insulating films 3a and 3b are each made of $SiO_2$, for example.

The second insulating film 6 is, for example, a gate insulating film. The second insulating film 6 includes a SiNx film and a $SiO_2$ film deposited sequentially by PECVD. The second insulating film 6 may alternatively be a single-layer film such as a $SiO_2$ film or a SiNx film.

The oxide semiconductor film 7 is formed by (i) forming an oxide semiconductor film by sputtering and (ii) patterning the oxide semiconductor film. An oxide semiconductor has an electron mobility 20 to 50 times higher than that of amorphous silicon as an amorphous semiconductor. This allows each transistor of the optical shutter substrate to switch on and off rapidly, and in turn allows the shutter body 28 of each optical shutter mechanism to open and close rapidly.

The oxide semiconductor film 7 may contain, for example, at least one metallic element among In, Ga, and Zn. The oxide semiconductor layer 7 contains, for example, an In—Ga—Zn—O based semiconductor (for example, an indium gallium zinc oxide). An In—Ga—Zn—O based semiconductor is a ternary oxide of indium (In), gallium (Ga), and zinc (Zn). The ratio (composition ratio) of In, Ga, and Zn is not limited to any particular one, and may be, for example, In:Ga:Zn=2:2:1, In:Ga:Zn=1:1:1, or In:Ga:Zn=1:1:2.

The oxide semiconductor film 7 may contain, for example, an In—Sn—Zn—O based semiconductor (for example, $In_2O_3$—$SnO_2$—ZnO; InSnZnO). An In—Sn—Zn—O based semiconductor is a ternary oxide of indium (In), tin (Sn), and zinc (Zn). The oxide semiconductor layer 7 may include a channel layer made of, for example, an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, and/or a Hf—In—Zn—O based semiconductor, where Al represents aluminum, Ti represents titanium, Cd represents cadmium, Ge represents germanium, Pb represents lead, Mg represents magnesium, Zr represents zirconium, and Hf represents hafnium.

The passivation films 10a and 10b are each formed by forming a SiNx film and a $SiO_2$ film sequentially by PECVD and patterning the SiNx film and the $SiO_2$ film. The passivation films 10a and 10b may each alternatively be a single-layer film such as a $SiO_2$ film or a SiNx film.

The first metal film, the second metal film, and the fourth metal film are each formed by (i) forming at least one layer of a metal such as aluminum (Al), tungsten (W), molybdenum (Mo), chrome (Cr), titanium (Ti), copper (Cu), or an alloy of such metals by sputtering and (ii) patterning the at least one layer.

The third metal film 12 is, for example, a light-transmitting metal film made of indium tin oxide (ITO) or indium zincum oxide (IZO).

Each optical shutter mechanism is formed by, for example, photolithography and etching with use of (i) n+ amorphous silicon, (ii) a metal such as aluminum (Al), tungsten (W), molybdenum (Mo), tantalum (Ta), chrome (Cr), titanium (Ti), copper (Cu) or an alloy of such metals, and (iii) SiNx.

FIG. 4 illustrates a TFT (for example, the transistor TR4 in FIG. 2) as being formed by the first metal film 5, the second insulating film 6, the oxide semiconductor film 7, and the second metal films 9s and 9d. FIG. 4 also illustrates the second metal film 9d and the third metal film 12 being in contact with each other in a contact hole to be electrically connected to each other which contact hole is in an interlayer insulating film F constituted by the passivation film 10a, the third insulating film 11, and the passivation film 10b. FIG. 4 illustrates a fourth metal film 13 on the third metal film 12.

The first insulating film 4 has a hole (bore) that coincides with the first metal film 5, in which hole a TFT is present.

The configuration in FIG. 4 allows the parasitic capacitance between the first metal film 5 and each of the second metal films 9s and 9d to be small. The configuration also includes on the first metal film 5 a first insulating film 4 having a planarizing function. This allows the first metal film 5 to, for example, have a large thickness and/or be edged.

FIG. 5 illustrates a contact hole CH in a region in which the third metal film 12 is present. The first metal film 5 and the third metal film 12 are in contact with each other at the bottom of the contact hole CH to be electrically connected to each other. Further, the second metal film 9, which extends through the sidewall of the contact hole CH toward the inside thereof, and the third metal film 12 are in contact with each other to be electrically connected to each other. This causes the first metal film 5 and the second metal film 9 to be electrically connected to each other. The first metal film 5 and the second metal film 9 are, in other words, electrically connected to each other without being in contact with each other (that is, via the third metal film 12).

The contact hole CH includes a first hole H1 in the first insulating film 4, a second hole H2 in the second insulating film 6, and a third hole H3 in the third insulating film 11. In a plan view of the contact hole CH in FIG. 5, (i) the second metal film 9 overlaps with the oxide semiconductor film 7, (ii) the third hole H3 has an opening K3 in the region in which the oxide semiconductor film 7 is present, and overlaps with the second metal film 9 and the entire opening K1 of the first hole H1, (iii) the second hole H2 has an opening K2 within the opening K1 of the first hole H1 and is aligned with the opening Kx of the oxide semiconductor film 7, and (iv) the third metal film 12 overlaps with the entire opening K3 of the third hole H3.

In the contact hole CH, the first metal film 5 and the third metal film 12 are in contact with each other inside the second hole H2, which is present in the first hole H1, to be electrically connected to each other. Further, in the contact hole CH, the second metal film 9 and the third metal film 12 are in contact with each other in a region above the first insulating film 4 (that is, at a position that coincides with the first insulating film 4 and that is above the first insulating film 4) and below the third hole H3 (that is, at a position that coincides with the third hole H3 and that is below the third hole H3) to be electrically connected to each other. This causes the first metal film 5 and the second metal film 9 to be electrically connected to each other.

Since a second hole H2 is present inside the first hole H1 below the third hole, the second insulating film 6 and the oxide semiconductor film 7, which overlap with each other in a region below the third hole H3, each have a two-step shape. The oxide semiconductor film 7 thus has (i) a first portion 7f in a region below the third hole H3 and inside the first hole H1 and (ii) a second portion 7s in a region below the third hole H3 and above the first insulating film 4. The first portion 7f and the second portion 7s are in contact with the third metal film 12. The second portion 7s is in contact with the second metal film 9.

The above configuration allows the third metal film 12 to be guided to the first metal film 5 at the bottom of the contact hole CH via the first portion 7f and the second portion 7s (which provide a two-step shape) of the oxide semiconductor film 7 in the contact hole CH. This reduces the possibility of step-caused disconnection of the third metal film 12 in the contact hole CH as compared to the form illustrated in FIG. 6.

That portion of the oxide semiconductor film 7 which is below the third hole H3 coincides entirely with the second insulating film 6. The first portion 7f of the oxide semiconductor film 7, the second insulating film 6, and the third metal film 12 overlap with one another. The second portion 7s of the oxide semiconductor film 7, the second metal film 9, and the third metal film 12 overlap with one another. The first metal film 5 and the second metal film 9 are in no contact with each other in the contact hole CH.

Embodiment 1 is configured such that the oxide semiconductor film 7 has a first portion 7f and a second portion 7s (which provide a two-step shape) for respective halves of the contact hole CH as divided by a plane that passes through the center of the contact hole CH and that includes (i) a line perpendicular to the direction in which the first metal film 5 extends and (ii) a line normal to the substrate surface and that the second metal film 9 and the third metal film 12 are connected to each other in the region of only one of the two portions.

(Method for Producing Active Matrix Substrate)

FIG. 7 is a flowchart that shows part of a process of producing an active matrix substrate. Step S1 is a step of forming and patterning a light-blocking film 2. Step S2 is a step of forming and patterning a first metal film 5. Step S3 is a step of forming and patterning a first insulating film 4. Step S3 involves forming in the first insulating film 4 a hole H1 illustrated in FIG. 5 (see (a) of FIG. 8). Step S4 is a step of forming a second insulating film 6.

Step S5 is a step of forming an oxide semiconductor film 7. Step S6 is a step of high-temperature annealing with respect to the oxide semiconductor layer 7. The high-temperature annealing is carried out, for example, in an atmosphere of nitrogen at 400° C. to 500° C. for 1 to 2 hours.

Step S7 is a step of patterning the oxide semiconductor film 7. Step S7 involves forming a first portion 7f and a second portion 7s of the oxide semiconductor film 7 and an opening Kx of the oxide semiconductor film 7 (see (b) of FIG. 8).

Step S8 is a step of forming and patterning a second metal film 9. Step S8 involves forming a second metal film 9 such that a portion of the second metal film 9 is inside the region of the third hole H3 as in FIG. 5.

Step S9 is a step of forming a passivation film 10a. Step S10 is a step of forming a third insulating film 11. Step S11 is a step of forming a passivation film 10b.

Step S12 is a step of patterning the interlayer insulating film F (namely, the passivation film 10a, the third insulating film 11, and the passivation film 10b) and the second insulating film 6 by dry etching. Specifically, step S12 involves forming a third hole H3 in the third insulating film 11 and a second hole H2 in the second insulating film 6 to form a contact hole CH.

Step S12 utilizes the property of an oxide semiconductor being not easily dry-etched. The first portion 7f and the second portion 7s of the oxide semiconductor film 7 each function as an etch stopper during the contact hole formation. Step S12 results in exposure of the second metal film 9, the first portion 7f and the second portion 7s of the oxide semiconductor film 7, and the first metal film 5 in the contact hole CH (see (c) of FIG. 8).

Step S13 is a step of forming a third metal film 12 on the interlayer insulating film F. The third metal film 12 comes into contact with the first metal film 5 and the second metal film 9 in the contact hole CH. This causes the first metal film 5 and the second metal film 9 to be electrically connected to each other. The third metal film 12 extends from above toward the bottom of the contact hole CH sequentially via a portion of contact with the second metal film 9, a portion of contact with the second portion 7s of the oxide semiconductor film 7, and a portion of contact with the first portion 7f of the oxide semiconductor film 7 before reaching a portion of contact with the first metal film 5 at the bottom of the contact hole CH. This reduces the possibility of step-caused disconnection of the third metal film 12 in the contact hole CH.

Carrying out the above steps produces an active matrix substrate 17 in FIG. 5.

Embodiment 2

(a) of FIG. 9 is a cross-sectional view of a metal film contact hole portion of the active matrix substrate in accordance with Embodiment 2. (b) and (c) of FIG. 9 are each a perspective plan view corresponding to (a) of FIG. 9. The present embodiment has a TFT portion similar to that for Embodiment 1.

Embodiment 2 differs from Embodiment 1 in that an oxide semiconductor film 7 is present only in one Px of halves of the contact hole CH as divided by a plane G that passes through the center of the contact hole CH and that includes (i) a line perpendicular to the direction in which the first metal film 5 extends and (ii) a line normal to the substrate surface, the oxide semiconductor film 7 having a two-step shape (that is, having (i) a first portion 7f in a region below the third hole H3 and inside the first hole H1 and (ii) a second portion 7s in a region below the third hole H3 and above the first insulating film 4), and that the second metal film 9 and the third metal film 12 are connected to each other in the other Py.

In FIG. 9, (i) the first metal film 5 and the third metal film 12 are in contact with each other inside the second hole H2, which is present in the first hole H1, to be electrically connected to each other, and (ii) the second metal film 9 and the third metal film 12 are in contact with each other in a region above the first insulating film 4 and below the third hole H3 to be electrically connected to each other in one Py of the two halves of the contact hole CH. This causes the first metal film 5 and the second metal film 9 to be electrically connected to each other.

The first portion 7f and the second portion 7s of the oxide semiconductor film 7 are in contact with the third metal film 12 only in one Px of the two halves of the contact hole CH. This configuration allows the third metal film 12 to be guided to the first metal film 5 at the bottom of the contact hole CH via the first portion 7f and the second portion 7s (which provide a two-step shape) of the oxide semiconductor film 7. This reduces the possibility of step-caused disconnection of the third metal film 12 in the contact hole CH as compared to the form illustrated in FIG. 6.

The opening K1 of the first hole H1 and the opening K2 of the second hole H2 may each have a width (that is, the dimension perpendicular to the direction in which the first metal film 5 extends) such that the opening K2 is wider than the opening K1 as illustrated in (b) of FIG. 9 or that the opening K1 is wider than the opening K2 as illustrated in (c) of FIG. 9.

Embodiment 3

(a) of FIG. 10 is a cross-sectional view of a metal film contact hole portion of the active matrix substrate in accordance with Embodiment 3. (b) and (c) of FIG. 10 are each a perspective plan view corresponding to (a) of FIG. 10. The present embodiment has a TFT portion similar to that for Embodiment 1.

Embodiment 3 differs from Embodiment 1 in that an oxide semiconductor film 7 is present only in one Py of halves of the contact hole CH as divided by a plane G that passes through the center of the contact hole CH and that includes (i) a line perpendicular to the direction in which the first metal film 5 extends and (ii) a line normal to the substrate surface, the oxide semiconductor film 7 having a two-step shape (that is, having (i) a first portion 7f in a region below the third hole H3 and inside the first hole H1 and (ii) a second portion 7s in a region below the third hole H3 and above the first insulating film 4), and that the second metal film 9 and the third metal film 12 are connected to each other.

In FIG. 10, (i) the first metal film 5 and the third metal film 12 are in contact with each other inside the second hole H2, which is present in the first hole H1, to be electrically connected to each other, and (ii) the second metal film 9 and the third metal film 12 are in contact with each other in a region above the first insulating film 4 and below the third hole H3 to be electrically connected to each other in one Py of the two halves of the contact hole CH. This causes the first metal film 5 and the second metal film 9 to be electrically connected to each other.

The first portion 7f and the second portion 7s are in contact with the third metal film 12 only in one Px of the two halves of the contact hole CH. This configuration allows the third metal film 12 to be guided to the first metal film 5 at the bottom of the contact hole CH via the first portion 7f and the second portion 7s (which provide a two-step shape) of the oxide semiconductor film 7. This reduces the possibility of step-caused disconnection of the third metal film 12 in the contact hole CH as compared to the form illustrated in FIG. 6.

The opening K1 of the first hole H1 and the opening K2 of the second hole H2 may each have a width (that is, the dimension perpendicular to the direction in which the first metal film 5 extends) such that the opening K2 is wider than the opening K1 as illustrated in (b) of FIG. 10 or that the opening K1 is wider than the opening K2 as illustrated in (c) of FIG. 10.

Embodiment 4

(a) of FIG. 11 is a cross-sectional view of a metal film contact hole portion of the active matrix substrate in accordance with Embodiment 4. (b) and (c) of FIG. 11 are each a perspective plan view corresponding to (a) of FIG. 11. The present embodiment has a TFT portion similar to that for Embodiment 1.

The active matrix substrate 17 in accordance with Embodiment 4 is configured such that in a plan view, (i) the second metal film 9 overlaps with the oxide semiconductor film 7, (ii) the third hole H3 has an opening K3 in the region in which the oxide semiconductor film 7 is present, and overlaps with the second metal film 9 and the entire opening K1 of the first hole H1, (iii) the opening K2 of the second hole H2 and the opening K1 of the first hole H1 are aligned with the opening Kx of the oxide semiconductor film 7, and (iv) the third metal film 12 overlaps with the entire opening K3 of the third hole H3.

In the contact hole CH, (i) the first metal film 5 and the third metal film 12 are in contact with each other inside the first hole H1 to be electrically connected to each other, and (ii) the second metal film 9 and the third metal film 12 are in contact with each other in a region above the first insulating film 4 and below the third hole H3 to be electrically connected to each other. This causes the first metal film 5 and the second metal film 9 to be electrically connected to each other.

The oxide semiconductor film 7 is present in a region below the third hole H3 and above the first insulating film 4 and the second insulating film 6, and is in contact with the second metal film 9 and the third metal film 12.

The above configuration allows the third metal film 12 to be guided to the first metal film 5 at the bottom of the contact hole CH via the oxide semiconductor film 7 in the contact hole CH. This reduces the possibility of step-caused disconnection of the third metal film 12 in the contact hole CH as compared to the form illustrated in FIG. 6.

That portion of the oxide semiconductor film 7 which is below the third hole H3 coincides entirely with the second insulating film 6. The first metal film 5 and the second metal film 9 are in no contact with each other in the contact hole CH.

Embodiment 1 is configured such that the oxide semiconductor film 7 is present in each half of the contact hole CH as divided by a plane that passes through the center of the contact hole CH and that includes (i) a line perpendicular to the direction in which the first metal film 5 extends and (ii) a line normal to the substrate surface and that the second metal film 9 and the third metal film 12 are connected to each other in the region of only one of the two portions.

Embodiment 5

Embodiment 1 described above is related to a MEMS display. The present invention is, however, not limited to such a configuration. The active matrix substrates in accordance with Embodiments 1 to 4 are each usable in a liquid crystal display device as well.

The liquid crystal display device 100 in accordance with Embodiment 5 includes, as illustrated in (a) of FIG. 12, (i) a liquid crystal panel 67 including an active matrix substrate 27 and a counter substrate (color filter substrate) 37 and (ii) a backlight BL configured to emit, for example, LED light or laser light to the active matrix substrate 27. The liquid crystal panel 67 has pixels PIX, in each of which (i) the pixel electrode for a liquid crystal capacitance LC is connected via a transistor Tr to a data signal line DS and a scanning signal line SC, and (ii) the counter electrode for the liquid crystal capacitance LC is connected to a common electrode line COM (see (b) of FIG. 12).

The liquid crystal panel 67 may include, for example, an active matrix substrate 27 that is identical to the active matrix substrate 17 in accordance with Embodiment 1 (see FIGS. 4 and 5) except that the active matrix substrate 27 excludes a light-blocking film 2 and an inorganic insulating film 3a (see FIG. 13). The liquid crystal panel 67 may alternatively include an active matrix substrate 27 that is identical to the active matrix substrate 17 in accordance with Embodiment 4 (see FIGS. 4 and 11) except that the active matrix substrate 27 excludes a light-blocking film 2 and an inorganic insulating film 3a (see FIG. 14). Similar descriptions apply to Embodiments 2 and 3.

Regarding Embodiments 1 to 4

The active matrix substrates in accordance with Embodiments 1 to 4 are each configured such that the first metal film 5 and the second metal film 9 are electrically connected to each other. The layers in which those metal films are present are not limited to those described for the embodiments. An active matrix substrate in accordance with an aspect of the present invention is generally usable in display devices including an active matrix substrate in which two metal films present in respective layers different from each other are electrically connected to each other (in particular, an active matrix substrate including, between such metal films, an insulating film formed by applying a material and/or an organic insulating film). Such an active matrix substrate is also suitably usable in an organic EL display including organic light-emitting diodes.

[Recap]

An active matrix substrate in accordance with a first aspect of the present invention includes: a substrate; a first insulating film present in a layer above the substrate; a second insulating film present in a layer above the first insulating film; a third insulating film present in a layer above the second insulating film; a first metal film present between the substrate and the first insulating film; a second metal film present in a layer between the second insulating film and the third insulating film; a third metal film having a portion present in a layer above the third insulating film; an oxide semiconductor film present in a layer between the second insulating film and the second metal film; and a contact hole electrically connecting the first metal film and the second metal film to each other, the contact hole including a first hole in the first insulating film, a second hole in the second insulating film, and a third hole in the third insulating film, the first metal film and the third metal film being in contact with each other inside the first hole, the second insulating film and the oxide semiconductor film overlapping with each other in a region below the third hole, the second metal film and the third metal film being in contact with each other in a region above the first insulating film and either inside or below the third hole.

An active matrix substrate in accordance with a second aspect of the present invention is configured as in the first aspect, and is further configured such that the second hole is present inside the first hole, and the first metal film and the third metal film are in contact with each other inside the second hole.

An active matrix substrate in accordance with a third aspect of the present invention is configured as in the first aspect, and is further configured such that the oxide semiconductor film has a first portion in a region below the third hole and inside the first hole, and the first portion is in contact with the third metal film.

An active matrix substrate in accordance with a fourth aspect of the present invention is configured as in the third aspect, and is further configured such that the oxide semiconductor film has a second portion in a region below the third hole and above the first insulating film, and the second portion is in contact with the third metal film.

An active matrix substrate in accordance with a fifth aspect of the present invention is configured as in the first or second aspect, and is further configured such that a portion of the oxide semiconductor film which portion is below the third hole coincides entirely with the second insulating film.

An active matrix substrate in accordance with a sixth aspect of the present invention is configured as in the fourth aspect, and is further configured such that the second portion is in contact with the second metal film.

An active matrix substrate in accordance with a seventh aspect of the present invention is configured as in the sixth aspect, and is further configured such that the first portion, the second insulating film, and the third metal film overlap with one another, and the second portion, the second metal film, and the third metal film overlap with one another.

An active matrix substrate in accordance with an eighth aspect of the present invention is configured as in any one of the first to seventh aspects, and is further configured such that in a plan view, the third hole has an opening that overlaps with an entire opening of the first hole.

An active matrix substrate in accordance with a ninth aspect of the present invention is configured as in the eighth aspect, and is further configured such that the oxide semiconductor film has an opening inside the first hole in a plan view.

An active matrix substrate in accordance with a tenth aspect of the present invention is configured as in any one of the first to ninth aspects, and is further configured such that the first metal film and the third metal film are in no contact with each other in the contact hole.

An active matrix substrate in accordance with an eleventh aspect of the present invention is configured as in any one of the first to tenth aspects, and is further configured such that the third metal film is a transparent conductive film.

An active matrix substrate in accordance with a twelfth aspect of the present invention is configured as in any one of the first to eleventh aspects, and is further configured such that the first insulating film and the third insulating film each contain an organic material.

An active matrix substrate in accordance with a thirteenth aspect of the present invention is configured as in any one of the first to twelfth aspects, and is further configured such that the second insulating film contains an inorganic material.

An optical shutter substrate in accordance with a fourteenth aspect of the present invention includes: an active matrix substrate according to any one of the first to thirteenth aspects; and an optical shutter mechanism on the active matrix substrate.

A display device in accordance with a fifteenth aspect of the present invention includes: an active matrix substrate according to any one of the first to thirteenth aspects.

A display device in accordance with a sixteenth aspect of the present invention is configured as in the fifteenth aspect, and is further configured such that the active matrix substrate is provided with an organic light-emitting diode.

A method in accordance with a seventeenth aspect of the present invention for producing an active matrix substrate includes the steps of: forming a first insulating film in a layer above a first metal film; forming a second insulating film in a layer above the first insulating film; forming an oxide semiconductor film in a layer above the second insulating film; forming a second metal film in a layer above the oxide semiconductor film; forming a third insulating film in a layer above the second metal film; forming a contact hole in the first insulating film, the second insulating film, and the third insulating film in such a manner that the first metal film, the second metal film, and the oxide semiconductor film are exposed; and forming a third metal film in such a manner that the third metal film is in contact with the first metal film, the second metal film, and the oxide semiconductor film.

A method in accordance with an eighteenth aspect of the present invention for producing an active matrix substrate is configured as in the seventeenth aspect, and is further configured such that the oxide semiconductor film functions as an etch stopper during the step of forming the contact hole.

The present invention is not limited to the description of the embodiments above, but may be altered in various ways by a skilled person within the scope of the claims. The present invention also encompasses in its technical scope any embodiment based on an appropriate combination of technical means disclosed in different embodiments. Further, technical means disclosed in different embodiments may be combined to provide a new technical feature.

REFERENCE SIGNS LIST

1 Glass substrate
2 Light blocking film
4 First insulating film
5 First metal film
6 Second insulating film
7 Oxide semiconductor film
7f First portion
7s Second portion
9 (9s, 9d) Second metal film
10a, 10b Passivation film
11 Third insulating film
12 Third metal film
13 Fourth metal film
17 Active matrix substrate
20 Optical shutter substrate
21 Optical shutter mechanism
22x, 22y Driving beam
23x, 23y Shutter beam
27 Active matrix substrate
28 Shutter body
30 Counter substrate
LW Light transmission path
F Interlayer insulating film

We claim:

1. An active matrix substrate, comprising:
a substrate;
a first insulating film present in a layer above the substrate;
a second insulating film present in a layer above the first insulating film;
a third insulating film present in a layer above the second insulating film;
a first metal film present between the substrate and the first insulating film;
a second metal film present in a layer between the second insulating film and the third insulating film;
a third metal film having a portion present in a layer above the third insulating film;
an oxide semiconductor film present in a layer between the second insulating film and the second metal film; and
a contact hole electrically connecting the first metal film and the second metal film to each other,
the contact hole including a first hole in the first insulating film, a second hole in the second insulating film, and a third hole in the third insulating film,
the first metal film and the third metal film being in contact with each other inside the first hole,
the second insulating film and the oxide semiconductor film overlapping with each other in a region below the third hole,
the second metal film and the third metal film being in contact with each other in a region above the first insulating film and either inside or below the third hole.

2. The active matrix substrate according to claim 1, wherein
the second hole is present inside the first hole, and
the first metal film and the third metal film are in contact with each other inside the second hole.

3. The active matrix substrate according to claim 1, wherein
the oxide semiconductor film has a first portion in a region below the third hole and inside the first hole, and
the first portion is in contact with the third metal film.

4. The active matrix substrate according to claim 3, wherein
the oxide semiconductor film has a second portion in a region below the third hole and above the first insulating film, and
the second portion is in contact with the third metal film.

5. The active matrix substrate according to claim 1, wherein
a portion of the oxide semiconductor film which portion is below the third hole coincides entirely with the second insulating film.

6. The active matrix substrate according to claim 4, wherein
the second portion is in contact with the second metal film.

7. The active matrix substrate according to claim 6, wherein
the first portion, the second insulating film, and the third metal film overlap with one another, and
the second portion, the second metal film, and the third metal film overlap with one another.

8. The active matrix substrate according to claim 1, wherein
in a plan view, the third hole has an opening that overlaps with an entire opening of the first hole.

9. The active matrix substrate according to claim 8, wherein
the oxide semiconductor film has an opening inside the first hole in a plan view.

10. The active matrix substrate according to claim 1, wherein
the first metal film and the third metal film are in no contact with each other in the contact hole.

11. The active matrix substrate according to claim 1, wherein
the third metal film is a transparent conductive film.

12. The active matrix substrate according to claim 1, wherein
the first insulating film and the third insulating film each contain an organic material.

13. The active matrix substrate according to claim 1, wherein
the second insulating film contains an inorganic material.

14. An optical shutter substrate, comprising:
an active matrix substrate according to claim 1; and
an optical shutter mechanism on the active matrix substrate.

15. A display device, comprising:
an active matrix substrate according to claim 1.

16. The display device according to claim 15, wherein
the active matrix substrate is provided with an organic light-emitting diode.

17. A method for producing an active matrix substrate, the method comprising the steps of:
forming a first insulating film in a layer above a first metal film;
forming a second insulating film in a layer above the first insulating film;
forming an oxide semiconductor film in a layer above the second insulating film;
forming a second metal film in a layer above the oxide semiconductor film;
forming a third insulating film in a layer above the second metal film;
forming a contact hole in the first insulating film, the second insulating film, and the third insulating film in such a manner that the first metal film, the second metal film, and the oxide semiconductor film are exposed; and
forming a third metal film in such a manner that the third metal film is in contact with the first metal film, the second metal film, and the oxide semiconductor film.

18. The method according to claim 17, wherein
the oxide semiconductor film functions as an etch stopper during the step of forming the contact hole.

* * * * *